(12) United States Patent
Murley et al.

(10) Patent No.: US 6,566,179 B2
(45) Date of Patent: May 20, 2003

(54) METHOD OF MANUFACTURING A TRANSISTOR

(75) Inventors: Darren T. Murley, Crawley (GB); Michael J. Trainor, Horley (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/814,390

(22) Filed: Mar. 21, 2001

(65) Prior Publication Data

US 2001/0024866 A1 Sep. 27, 2001

(30) Foreign Application Priority Data

Mar. 23, 2000 (GB) ............................................. 0006958

(51) Int. Cl.[7] ............................................. H01L 21/00
(52) U.S. Cl. ......................... 438/166; 438/96; 438/97; 438/149
(58) Field of Search ............................ 438/96, 97, 149, 438/162, 166, 154, 482

(56) References Cited

U.S. PATENT DOCUMENTS

| 5,147,826 A | | 9/1992 | Liu et al. ........................ 437/233 |
| 5,275,851 A | | 3/1993 | Fonash et al. .................. 427/578 |
| 5,543,352 A | | 8/1996 | Ohtani et al. .................. 437/101 |
| 5,563,426 A | * | 10/1996 | Zhang et al. ................... 257/66 |
| 5,643,826 A | * | 7/1997 | Ohtani et al. .................. 437/88 |
| 5,879,977 A | * | 3/1999 | Zhang et al. ................... 438/166 |
| 6,251,754 B1 | * | 6/2001 | Ohshima et al. ............... 438/506 |

OTHER PUBLICATIONS

Patent Abstracts of Japan, vol. 015, No. 047, P–1162, Feb. 1991.

* cited by examiner

Primary Examiner—Matthew Smith
Assistant Examiner—Renzo N. Rocchegiani

(57) ABSTRACT

A method of manufacturing a TFT (10) is disclosed comprising source (8) and drain (8") electrodes joined by a semiconductor channel (6) formed from a semiconductor layer (4), a gate insulating layer (7) and a gate electrode (8'). The method comprising the steps of applying a foil (2) comprising a crystallization enhancing material (CEM) and depositing the semiconductor layer (4) over a supporting substrate (1); and heating the semiconductor layer (4) so as to crystallize the semiconductor layer (4) from regions exposed to the CEM of the foil (2). The method may further comprise the step of providing a patterned barrier layer (3) between the foil (2) and the semiconductor layer (4) wherein the semiconductor layer (4) is crystallized from regions exposed through vias in the barrier layer (3) to the CEM of the foil (2).

Also disclosed is a TFT (10) manufactured by the same, and an active matrix device (20) comprising a row and column array of active elements (22) wherein each element (22) is associated with such a TFT (10) connected to corresponding row (24) and column (23) conductors.

22 Claims, 3 Drawing Sheets

METHOD OF MANUFACTURING A TRANSISTOR

BACKGROUND OF THE INVENTION

1. Field of the Invention

This invention relates to a method of manufacturing a thin film transistor (TFT) having a crystalline semiconductor channel formed from a silicon film having been crystallised using a crystallisation enhancing material (CEM), and to a TFT manufactured using the same. The invention further relates to an active matrix device, especially an active matrix liquid crystal display (AMLCD), comprising a row and column array of active elements wherein each element is associated with such a TFT by connection to corresponding row and column conductors.

2. Description of the Related Art

Conventionally, polysilicon (poly-Si) crystalline silicon films used in TFTs have been manufactured by depositing an amorphous silicon (a-Si) film on an insulating substrate and crystallising the a-Si film by exposing it to a high temperature for a prolonged period of time, typically in excess of 600° C. for up to 24 hours.

As an alternative, U.S. Pat. No. 5,147,826 discloses a lower temperature method of crystallising an a-Si film. The method comprises the steps of depositing a thin film of a CEM such as Nickel on the a-Si film and annealing the films at a temperature below that which would be required to produce crystalline growth in the absence of the CEM. The CEM stimulates crystal growth at temperatures below 600° C. and also provides more rapid crystal growth than would otherwise occur. For example, a typical anneal using the method of U.S. Pat. No. 5,147,826 might be at around 550° C. for 10 hours. This represents an improvement over non-CEM methods for at least two reasons: first, it enables low cost non-alkali glass substrates such as borosilicate to be used which would normally suffer glass compaction and warpage at temperatures of 600° C. or more; and secondly, as the anneal duration is reduced, the manufacturing throughput rate is increased and therefore the associated manufacturing cost may be reduced.

In a further development of this method, U.S. Pat. No. 5,543,352 discloses improving the resultant crystallinity by irradiating the film with a laser light. Without wishing to be bound by any theory, it is believed that the effect of this is to melt the grain boundaries between the highly orientated <111> crystalline silicon grains and to reform them to produce atomically continuous grain boundaries. The resultant crystalline structure has been referred to in the art as continuous grain silicon. Both U.S. Pat. No. 5,147,826 and U.S. Pat. No. 5,543,352 are incorporated hereinafter by reference.

In so far as exposing a-Si to a CEM is concerned, it is known to do this by either applying the CEM to an a-Si film already deposited, or by first depositing the CEM and subsequently depositing the a-Si film thereover. Further known is the direct application of the CEM to the a-Si, for example by sputtering, or application of a CEM as a solute in solution, for example Nickel dissolved in an acetate solution as described in Example 1 of U.S. Pat. No. 5,543,352. In none of the above examples does the application of the CEM provide the TFT with structural support.

From U.S. Pat. No. 5,476,810, it is known to manufacture an electronic device comprising a thin film circuits using a metal foil as a temporary support.

SUMMARY OF THE INVENTION

It is an object of the present invention to provide a method of manufacturing a TFT in which application of a CEM used to promote crystallisation may be further used to enhance the structural integrity of the TFT.

Therefore, in accordance with a first aspect of the present invention, there is provided a method of manufacturing a thin film transistor (TFT) comprising source and drain electrodes joined by a semiconductor channel formed from a semiconductor layer, a gate insulating layer and a gate electrode, the method comprises the steps of:

over a supporting substrate, depositing the semiconductor layer and applying a foil comprising a crystallisation enhancing material (CEM); and heating the semiconductor layer, ideally to a temperature not exceeding 600° C., so as to crystallise the semiconductor layer from regions exposed to the CEM of the foil.

Using this method, the foil can be used to provide the TFT with additional structural integrity. In particular, if the foil is applied first on the supporting substrate and the semiconductor layer deposited thereafter, it may be then possible to remove the TFT structure including foil from the supporting substrate at the interface between the foil and the supporting substrate. The foil may then be optionally replaced with an alternative supporting layer, for example, a flexible plastic layer.

By applying a foil, what is meant is the application on to the supporting substrate of a thin flexible sheet of material which may for example be stored on a roll prior to its application. Also, a foil comprising a CEM would include a foil having CEM particles distributed throughout it, a foil having a continuous or discontinuous CEM coating or a foil consisting substantially entirely of the CEM, impurities aside.

The method may further comprise the step of providing a patterned barrier layer between the foil and the semiconductor layer wherein the semiconductor layer is crystallised from regions exposed through vias in the barrier layer to the CEM of the foil. In particular, the barrier layer may be formed as a metal oxide of the foil or alternatively be separately deposited, for example, a silicon oxide layer deposited by plasma CVD.

Use of a barrier layer may prevent over exposure of the a-Si film to a CEM which is desirable as such overexposure can reduce the quality of crystallinity and adversely affect the electrical characteristics of the resultant TFT. For example, when the CEM is a metal and therefore a conductor, such overexposure can cause undesirable current leakage in the resultant TFT.

From regions of the semiconductor layer exposed through vias in the barrier layer to the CEM of the foil, further crystalline growth may occur laterally though the semiconductor layer extending to regions otherwise protected from the CEM by the barrier layer. Such laterally crystallised regions typically contain higher quality crystallinity than the regions exposed to the CEM.

Furthermore, where such lateral crystallisation occurs, the semiconductor layer may be etched after crystallisation to form the semiconductor channel whereby etching removes the regions of the semiconductor layer exposed through vias in the barrier layer to the CEM of the foil, i.e. leaving only the high quality laterally crystallised regions.

Also provided in accordance with the first aspect of the present invention is a TFT comprising source and drain electrodes joined by a semiconductor channel, a gate insulating layer and a gate electrode, all mounted on a foil comprising a crystallisation enhancing material (CEM). According to a second aspect of the present invention, an active matrix device is provided comprising a row and column array of active elements wherein each element is associated with a switching TFT of the aforementioned type and connected to corresponding row and column conductors.

Also provided in accordance with the second aspect of the present invention is an active matrix device comprising a row and column array of active elements wherein each element comprises a switching TFT connected to corresponding row and column conductors, all mounted on a foil comprising a crystallisation enhancing material (CEM).

According to a third aspect of the present invention, a method of manufacturing an active matrix device is provided comprising a row and column array of active elements wherein each element is associated with a switching TFT comprising source and drain electrodes joined by a semiconductor channel, a gate insulating layer and a gate electrode, and connected to corresponding row and column conductors. The method comprising the steps of exposing a semiconductor layer to a crystallisation enhancing material so as to crystallise the semiconductor layer from regions exposed to the CEM, and forming the semiconductor channel therefrom; and providing plastic, ideally flexible, supporting substrates either side of the active element array.

BRIEF DESCRIPTION OF THE DRAWINGS

Methods of manufacturing a TFT according to the present invention and an AMLCD incorporating TFTs manufactured by the same will now be described, by way of example only, with reference to the following drawings in which.

DETAILED DESCRIPTION OF THE PRESENTLY PREFERRED EMBODIMENTS

Figure 1A:
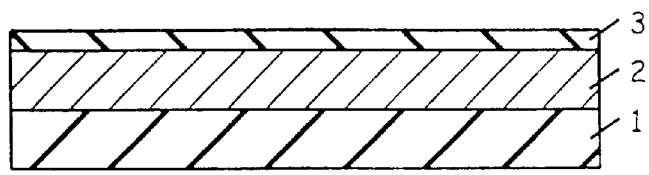
FIGS. 1A to 1D illustrate a method of manufacturing a TFT structure according to the present invention.
Figure 1B:
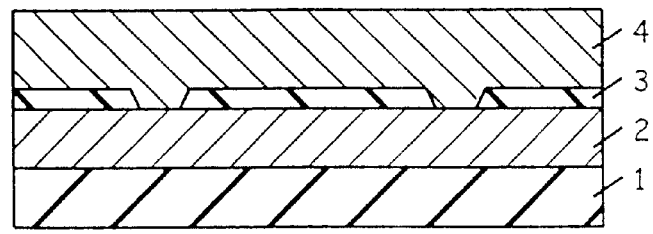

Referring to FIGS. 1A to 1D, a method of manufacturing a TFT according to the present invention is described below.

On a borosilicate glass substrate 1 such as Corning Co.'s No 1737, a 250 $\mu$m thick Nickel foil 2 is applied from a roll to the substrate. Next, by using plasma CVD, a silicon oxide film 3 is deposited on top of the Nickel foil to a thickness of between 50 nm to a few hundred nm, say 180 nm (1800 Å), and patterned using conventional mask etching techniques. An a-Si film 4 is then deposited on top of the silicon oxide film also by plasma CVD to a thickness of between 30 and 300 nm (30 to 3000 Å) and doped as indicated by the arrows in FIG. 1B in accordance with conventional semiconductor doping techniques. The resultant structure is then subjected to a furnace anneal whereby the structure is heated to a temperature of between 500° C. and 550° C. for a period of 10 hours.

Figure 1C:
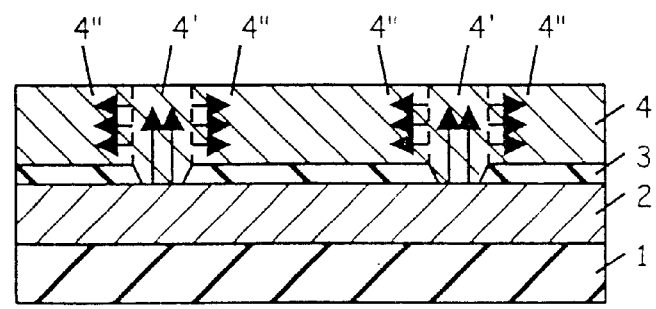

The manner of crystallisation of the a-Si film 4 during the furnace anneal is illustrated in FIG. 1C. In a region 4' where the a-Si film is exposed to the Nickel through vias in the silicon oxide film 3, an initial crystallisation occurs upwards from the interface between the Nickel foil 2 and silicon film 4'. Polycrystalline growth then extends from the initial crystallisation region 4' laterally over regions 4" of the silicon film otherwise protected from the effect of the Nickel foil 2, termed "lateral crystallisation". Optionally, to further improve the crystallinity of the silicon film after the furnace anneal, the film may be irradiated in the manner described in U.S. Pat. No. 5,543,352, ideally resulting in continuous grain silicon.

Figure 1D:
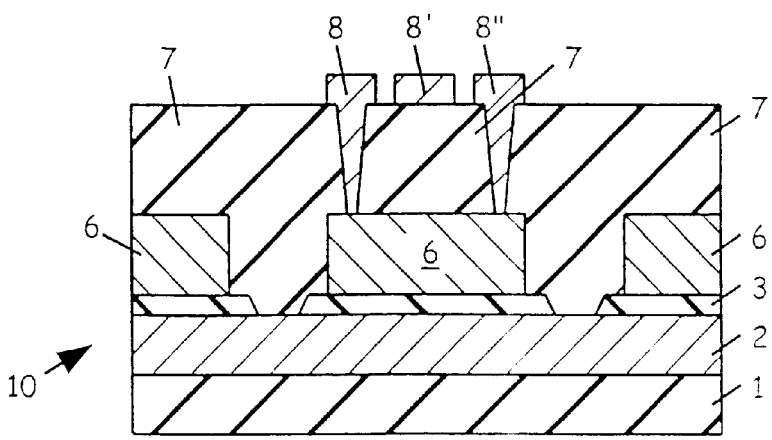

Once crystallised, the silicon film 4 is then etched to form device islands 6 using conventional mask etching techniques; a silicon oxide gate insulator layer is deposited using plasma CVD and patterned to form a gate insulator 7; and metal source 8, gate 8' and drain 8" electrodes are provided, resulting in the TFT structure 10 shown in FIG. 1D.

Figure 2:
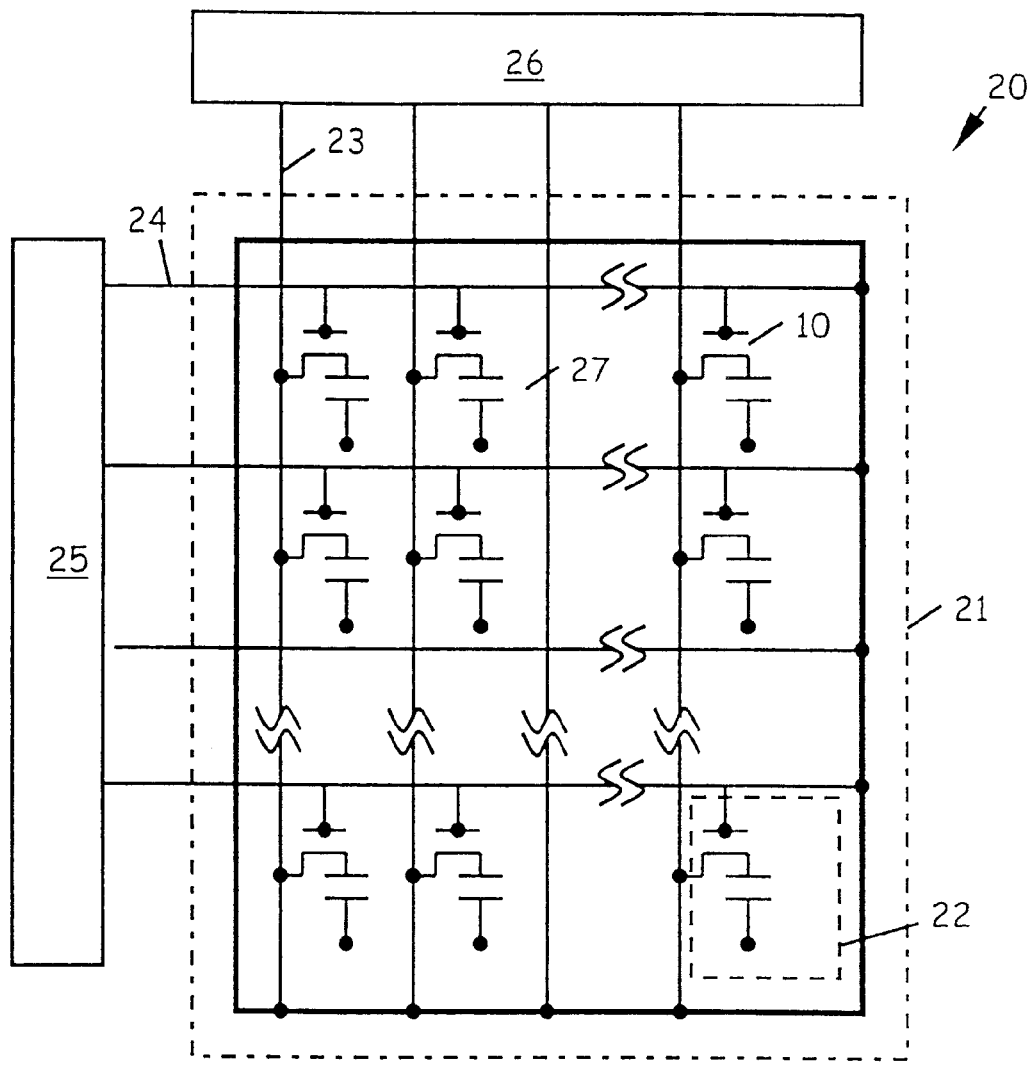
FIG. 2 shows, schematically, a AMLCD incorporating TFTs manufactured by the method illustrated in FIGS. 1A to 1D.

Referring to FIG. 2, an AMLCD is shown, schematically, incorporating TFTs manufactured by the method illustrated in FIGS. 1A to 1D. The AMLCD 20 comprises an display area 21 consisting of m rows (1 to m) and n columns (1 to n) of identical picture elements 22. Only a few of the picture elements are shown for simplicity whereas in practice, the total number of picture elements (m×n) in the display area may be 200,000 or more. Each picture element 22 has a picture electrode 27 and associated therewith a switching TFT 10 of the type manufactured by the method illustrated in FIGS. 1A to 1D, and which serves to control the application of data signal voltages to the picture electrode 27. The switching TFTs 10 have common operational characteristics and are each arranged adjacent to their associated picture element 22 with their respective drain 8" being connected to the picture electrode 27. The sources of all switching TFTs associated with one column of picture elements 22 are connected to a respective one of a set of parallel column conductors 23 and the gates 8' of all switching TFTs 10 associated with one row of picture elements 22 are connected to a respective one of a set of parallel row conductors 24. The TFTs 10 are controlled by gating signals provided via the row conductors 24 by row driver circuitry 25 external to the display area 21. Similarly, the TFTs 10 associated with picture elements 22 in the same column are provided with data signal voltages for the picture electrodes 27 by column driver circuitry 26 also external to the display panel. Of course, the configuration and operation of such AMLCD picture elements is well known and accordingly will not be elaborated upon here further.

Figure 3A:
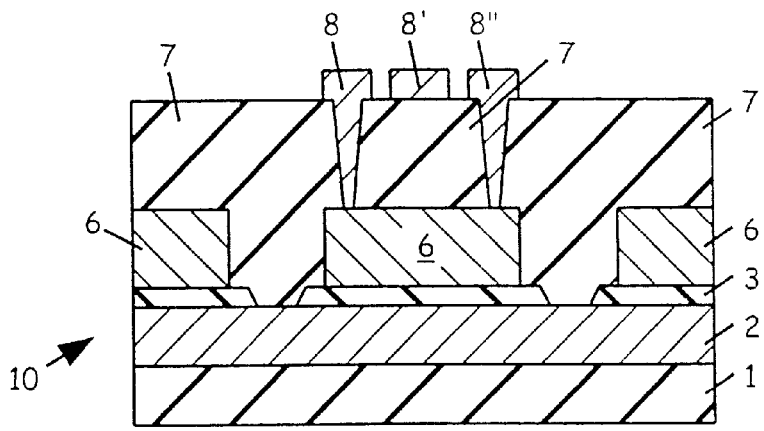
FIGS. 3A to 3C illustrate a further method of manufacturing a TFT structure based on the method illustrated in FIGS. 1A to 1D.
Figure 3B:
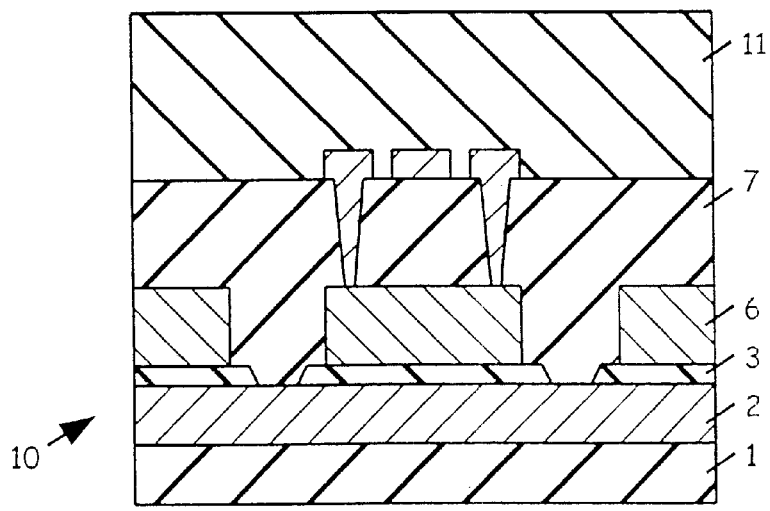
Figure 3C:
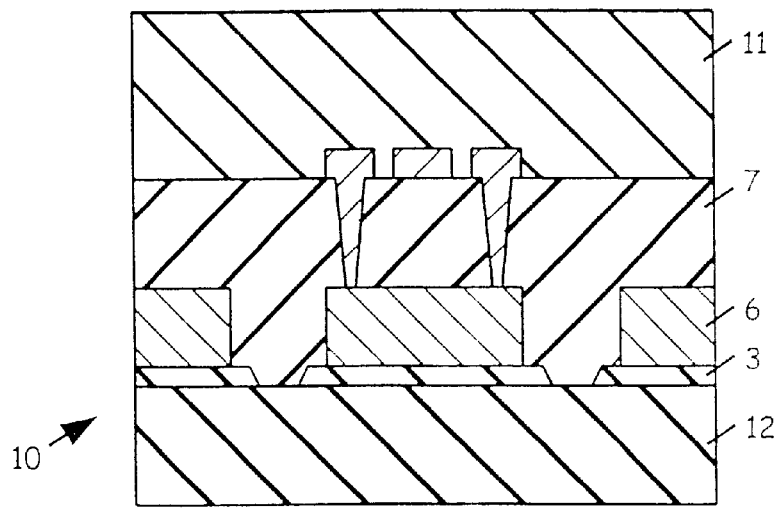

As stated previously, using a foil 2 may provide the TFT with sufficient structural integrity so as to be able to remove the foil and the TFT structure from the underlying substrate 1. This option is illustrated in FIGS. 3A and 3C in which a TFT structure manufactured by the method illustrated in FIGS. 1A to 1D (FIG. 1D reproduced at FIG. 3A for convenience) is overlaid with an upper supporting substrate 11. In the case of a AMLCD, this would including for example colour and polarising filter layers, liquid crystal material, spacers and physical protection layers, however, for the sake of clarity, details of these elements are omitted.

As illustrated in FIG. 3C, once the upper substrate 10 is in place, the TFT structure may be disengaged with the underlying substrate 1, the Nickel foil 2 etched away and an alternative underlying substrate 12 applied in place of the Nickel foil. The upper and alternative underlying substrates may consist of flexible plastic material and, to the inventors knowledge, the manufacture of such a device by a low temperature CEM enhanced method of crystallisation has not been accomplished before.

The specific considerations for the practical manufacture of thin film transistors and of active matrix devices incorporating the same will be apparent to those skilled in the art, and the considerations which should be applied for existing transistor designs should also be applied for design of a transistor in accordance with the invention. The precise process conditions which may be appropriate have not been described in this text, as this is a matter of normal design procedure for those skilled in the art. Also, whilst Nickel is perhaps the most widely used CEM, many other CEMs exist including Iron, Cobalt, Platinum and Palladium.

Lastly, a great deal of research and development of the low temperature crystallisation processes described in U.S. Pat. No. 5,147,826 and U.S. Pat. No. 5,543,352 has already been conducted and published in a spate of recent patent applications and granted patents, too numerous to mention individually. It is a relatively simple task for a person skilled in the art of TFT manufacture to access a modern patent database and to retrieve such information, for example by reference to U.S. Pat. No. 5,147,826 and U.S. Pat. No. 5,543,352, and to apply the teachings of these patents to the present invention where applicable.

What is claimed is:

1. A method of manufacturing a thin film transistor (TFT) including source and drain electrodes joined by a semiconductor channel formed from a semiconductor layer, a gate insulating layer and a gate electrode, the method comprising the steps of:

over a supporting substrate, applying a foil including a crystallisation enhancing material (CEM) and subsequently depositing a semiconductor layer;

providing a patterned barrier layer between the foil and the semiconductor layer; and heating the semiconductor layer so as to crystallise the semiconductor layer from regions exposed through vias in the barrier layer to the CEM of the foil,.

2. A method according to claim 1 wherein the barrier layer is formed as a metal oxide of the foil.

3. A method according to claim 1 wherein the barrier layer is silicon oxide.

4. A method according to claim 1 wherein from regions of the semiconductor layer exposed through vias in the barrier layer to the CEM of the foil, further crystalline growth occurs laterally though the semiconductor layer extending to regions otherwise protected from the CEM by the barrier layer.

5. A method according to claim 1 further comprising the step of etching the semiconductor layer after crystallisation to form the semiconductor channel whereby etching removes the regions of the semiconductor layer.

6. A method according to claim 1 wherein the foil consists substantially entirely of the CEM.

7. A method according to claim 1 further comprising:

a step of removing the TFT structure including the foil from the substrate.

8. A method according to claim 7 further comprising:

the step of removing the foil from the TFT structure and replacing with an alternative supporting layer.

9. A method according to 1 wherein the semiconductor layer is heated to a temperature not exceeding 600° C.

10. A method of manufacturing a thin film transistor including a gate insulator, a gate electrode, a source electrode and a drain electrode, said method comprising:

applying a foil to a first supporting substrate, said foil including a crystallisation enhancing material;

depositing a barrier layer on the foil;

forming vias in the barrier layer to expose portions of the foil;

depositing a semiconductor layer on the barrier layer and on the exposed portions of the foil; and fully crystallizing regions of the semiconductor layer deposited on the exposed portions of the foil.

11. The method of claim 10, further comprising:

partially crystallizing regions of the semiconductor layer deposited on the barrier layer.

12. The method of claim 10, further comprising;

etching the fully crystallized regions of the semiconductor layer to thereby form a semiconductor channel on each barrier layer.

13. The method of claim 12, further comprising:

forming the gate insulator on a first barrier layer;

forming the gate electrode on the gate insulator;

forming the source electrode on the first barrier layer; and forming the drain electrode on the first barrier layer.

14. The method of claim 13, further comprising:

forming a second support substrate on the gate insulator, the gate electrode, the source electrode and the drain electrode;

removing the first support substrate and the foil; and replacing the foil with a third support substrate.

15. The method of claim 10, wherein the foil is an undivided layer.

16. The method of claim 10, wherein the foil is a planar layer.

17. A method of manufacturing a thin film transistor including a gate insulator, a gate electrode, a source electrode and a drain electrode, said method comprising:

applying a foil to a first supporting substrate, said foil including a crystallisation enhancing material;

depositing a barrier layer on the foil;

forming vias in the barrier layer to expose portions of the foil;

depositing a semiconductor layer on the barrier layer and on the exposed portions of the foil; and continually heating the semiconductor layer for a period of time to thereby fully crystallize regions of the semiconductor layer deposited on the exposed portions of the foil and to thereby partially crystallize regions of the semiconductor layer deposited on the barrier layer.

18. The method of claim 17, further comprising;

etching the fully crystallized regions of the semiconductor layer to thereby form a semiconductor channel on each barrier layer.

19. The method of claim 18, further comprising:

forming the gate insulator on a first barrier layer;

forming the gate electrode on the gate insulator;

forming the source electrode on the first barrier layer; and forming the drain electrode on the first barrier layer.

20. The method of claim 19, further comprising:

forming a second support substrate on the gate insulator, the gate electrode, the source electrode and the drain electrode;

removing the first support substrate and the foil; and replacing the foil with a third support substrate.

21. The method of claim 17, wherein the foil is an undivided layer.

22. The method of claim 17, wherein the foil is a planar layer.

* * * * *